April 29, 1969 A. RASIEL ET AL 3,441,749

ELECTRONIC CLAMP

Filed Nov. 15, 1965

AMRAM RASIEL
WILLIAM M. HENEBRY
INVENTORS

BY Ralph L. Cadwallader
Leo M. Kelly
ATTORNEYS

United States Patent Office 3,441,749

Patented Apr. 29, 1969

3,441,749
ELECTRONIC CLAMP

Amram Rasiel, Rockport, and William M. Henebry, Marblehead, Mass., assignors, by mesne assignments, to EG & G, Inc., Bedford, Mass., a corporation of Massachusetts Filed Nov. 15, 1965, Ser. No. 507,871
Int. Cl. H03k 5/08
U.S. Cl. 307—237 3 Claims

ABSTRACT OF THE DISCLOSURE

A system for switching a source of recurrent pulses, selectively between an output and substantially zero potential by applying the recurrent signals simultaneously to an output terminal and to an operational amplifier. The operational amplifier being provided with a feedback loop having a series switch so that when the recurrent pulses are applied thereto, the operational amplifier will generate pulses of equal magnitude and frequency and opposite polarity with the equal and opposite pulses being applied to a junction point common to the input recurrent pulses, the output terminal, the feedback circuit and the input to the operational amplifier. Thus, when it is desired to utilize the recurrent pulses, the switch is opened to present a high impedance to the incoming signal and allow the incoming signals to be passed on to the output terminal.

Figure 1:
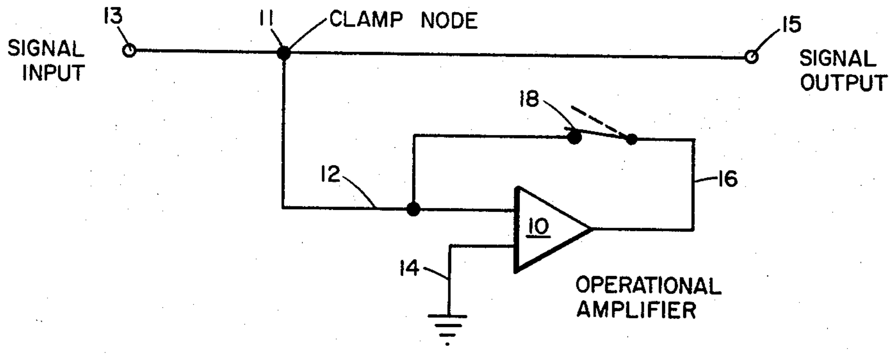

The present invention relates to generally to electronic clamps and, more particularly, to an electronic controlled clamp for use in circuitry where fast switching between an output and ground is desired.

Electronic controlled clamps of various sorts have been constructed in the past but insofar as known, all have possessed some undesirable attributes. Mechanical relays are, of course, too slow and transistor switches tend to be temperature sensitive. Furthermore, both exhibit undesirable noise sensitivity. Thus, a long felt want has heretofore existed in the electronics art for a fast-acting electronic controlled clamp to provide a simple but efficient means to switch analog signals between ground and readout. Such need has been particularly prevalent in telemetry where there is a constant need to switch a multiplicity of analog signals between ground and readout. Such a circuit also finds important use in time-to-amplitude converters where very fast switching action is essential for good data conversion at short time ranges. Moreover, it has been long desired to have such a fast electronic controlled clamp that was not subject to drift and which permitted the transmission of a signal without introducing any start transients on the leading edge of the signal.

The present invention avoids these shortcomings, provides a simple and yet efficient electronic controlled clamp for use as a shunt gate, and rapidly switches analog signals emanating from a source to either ground or an output. Moreover, the electronic controlled clamp of the invention, when it grounds the analog signal from the source, also effectively grounds the signal output as well. Furthermore, the electronic controlled clamp of the invention allows fast recovery even when the signal source and/or the readout device are capacitive.

It is, therefore, an object of the present invention to provide an electronic controlled clamp capable of switching analog signals issuing from a source to either ground or an output. More specifically, it is an object of the present invention to provide an electronic clamp for effecting very fast switching, on the order of a nanosecond, of signals from a source to either ground or an output, which clamp is subject to minimal drift, possesses almost no noise problems, and introduces hardly any undesirable start transients on the leading edge of the transmitted signal.

It is another object of the present invention to provide an electronic controlled clamp capable of serving as a fast-switching shunt gate, with little noise problems, in connecting a high impedance source to a high impedance readout or measuring device.

Still another object of the present invention is to provide an electronic clamp capable of performing analog gating functions in very fast analog multiplex systems.

Other and further objects and advantages of the present invention will in part be obvious and will in part be apparent from the following detailed description, the accompanying drawings, and the appended claims.

The invention accordingly comprises the electronic clamp possessing the construction, combination of elements, and arrangement of parts which are exemplified in the following detailed disclosure, and the scope of which will be indicated in the appended claims.

In general, the electronic clamp of the present invention comprises: a device characterized by an inherent tendency to maintain its input terminal at substantially zero (ground) potential or other reference potential, the input terminal of the device being coupled to a point between a signal source and a signal output; and an electronic switch forming an operative part of the device, the switch being operable upon command to enable or disable the device, thereby effectively grounding both the source and the output or permitting the signal source to be connected to the output.

Figure 2:
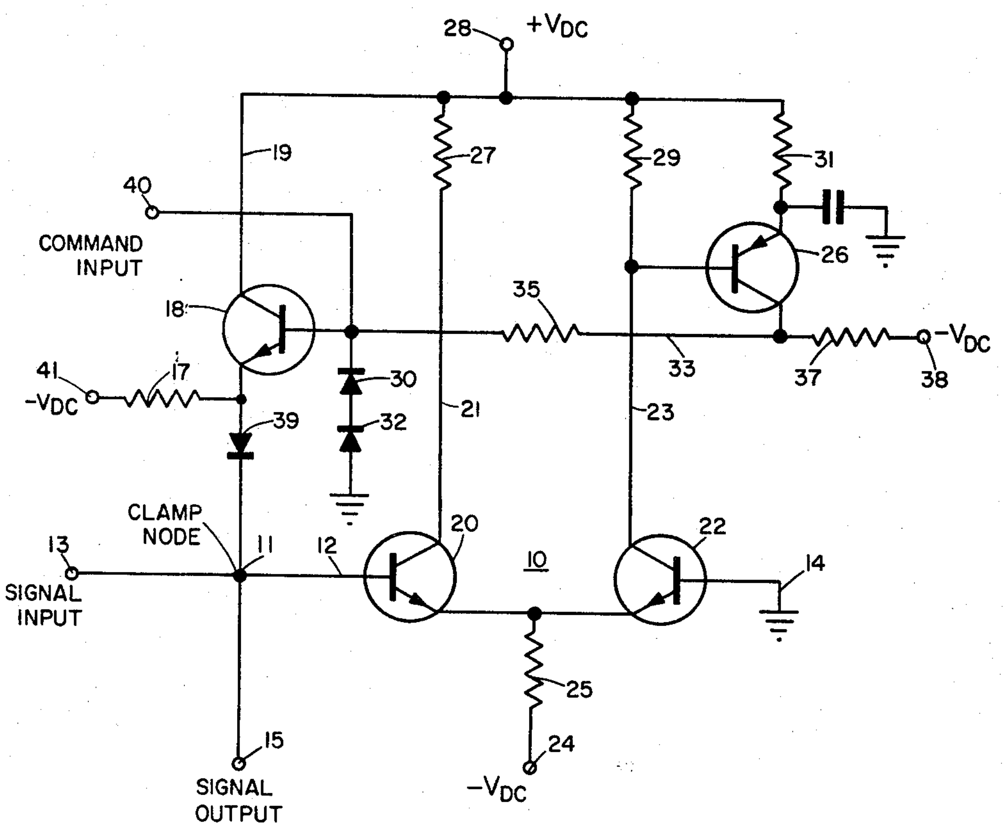

For a fuller understanding of the nature and objects of the invention, reference should be had to the following detailed description, taken in connection with the accompanying drawings wherein:

FIG. 1 is a block and circuit diagram of an electronic clamp constructed in accordance with and embodying the present invention; and FIG. 2 illustrates schematically the electronic components and electrical circuits of the electronic clamp shown in FIG. 1.

The principle of operation of the electronic clamp of the invention may be best described with reference to FIG. 1. In the drawings, like reference characters have been used throughout to describe like parts. FIG. 1 illustrates amplifier 10 which may be any amplifier having differential inputs, high gain, and low drift. Such an amplifier may, for example, be an operational amplifier, as shown in the preferred embodiment, having a high gain. Its input lead 12 connects to point 11, designated the clamp node, between signal input source 13 and a signal output 15. Those familiar with the electronics arts will appreciate that clamp node 11 is merely a junction point to which a number of circuits may be connected. It is to be understood that both signal input source 13 and signal output 15 may represent high impedance sources and outputs, respectively. Furthermore, it should be noted that it does not matter which terminal is used for input and which is used for output. Input lead 14 of amplifier 10 is grounded, or it may be connected to any other reference. Amplifier 10 is provided with feedback loop 16 between its output and its input 12. Electronic switch 18 forms part of feedback loop 16. The dashed lines illustrate schematically the open condition of switch 18.

The characteristics of operational amplifiers are well known to those skilled in the art. Basically, they possess an inherent tendency to maintain their inputs at substantially zero potential difference, by producing at their output terminals that voltage which is necessary to produce in the feedback loop a current that will be equal in magnitude to the current arriving at its input so as to maintain an effective balance in the voltages between its two input terminals. Consequently, and in further reference to FIG. 1, when electronic switch 18 of feedback loop 16 of operational amplifier 10 is in its schematically illustrated closed condition, and as a result amplifier 10 is enabled, amplifier 10 will effectively clamp point 11 between the signal input 13 and signal output 15 to ground or other reference potential. It is to be noted in this regard that both signal source 13 as well as signal output 15 are effectively grounded thereby. When, upon external command, electronic switch 18 is opened as shown in dashed lines, feedback loop 16 becomes disconnected, effectively preventing operational amplifier 10 from grounding out point 11, and any signal appearing at signal input 13 will be permitted to be transmitted to and appear at signal output 15.

Because of its well-understood inherent characteristics, operational amplifier 10 is particularly useful as a shunt gate, without noise problems, for connecting a high impedance source to either ground or a high impedance readout or measuring device. It is also, of course, known that analog signals may represent a great variety of important and useful values such as time intervals, pressures, temperatures, heart beats, breathing, etc., that need to be constantly monitored. In telemetry, such constant monitoring often requires very fast and continuous switching among a multiplicity of analog signals so that they may be monitored in sequence. Consequently, very fast switching becomes necessary from these analog signal sources to a signal readout device. This requires that all signal sources, except the one being read, be grounded and it also requires that there should be very fast switching action between signal readout and the various signal sources. Moreover, in such applications it is important that the signal, in being switched from ground to the readout device, not be subject to drift and that it should be devoid of any start transients on its leading edge, preventing thereby the introduction of errors in the readout. The electronic relay of the invention effectively, simply, and inexpensively, accomplishes such very fast switching action by the simple expedient of electronically enabling or disabling the operational amplifier 10, thereby either grounding both the signal source and the signal output or permitting the transmission of the signal from the source 13 to the output 15.

In FIG. 2 is shown one preferred embodiment of an electronic clamp constructed in accordance with and embodying the present invention. As may be observed, operational amplifier 10 is shown therein as comprising transistors 20 and 22, shown to be NPN transistors, and connected as a differential pair with their emitters directly connected to one another and by resistor 25 to a negative source of biasing potential 24. Their collector electrodes are shown connected, by respective leads 21 and 23 and resistors 27 and 29, to a positive source of biasing potential 28. The base of transistor 22 is connected to ground by lead 14, which represents one input, the grounded input of operational amplifier 10. The base of transistor 20 is shown connected by lead 12 to point 11, which represents the clamp node of the circuit. Lead 12 connecting clamp node 11 directly to the base of transistor 20, represents, of course, the other input of operational amplifier 10. As can be clearly seen, input 12 is connected through clamp node 11 both to signal input 13 and signal output 15.

Feedback loop 16 of operational amplifier 10, as shown in FIG. 2, may be traced from collector lead 23 to the base of transistor 26, which is a PNP transistor, and hence through its collector-base junction, lead 33 and resistor 35, to the base-emitter junction of electronic switch transistor 18, which is an NPN transistor, and hence through disconnect diode 39, connecting the emitter electrode of transistor switch 18 to clamp node 11. The emitter of transistor 18 is connected to the anode of diode 39, and also is connected, through resistor 17, to negative voltage source 41.

The collector electrode of transistor 26 is shown connected by resistor 37 to negative source of biasing potential 38, which negative source of biasing potential 38 is also coupled via resistor 35 to the base electrode of switching transistor 18. Two voltage limiting diodes 30 and 32 are also shown connected in series to a point between the base electrode of transistor 18 and the resistor 35, with the cathode of diode 30 connected to this point and the anode of diode 32 connected to ground. The emitter electrode of transistor 26 is furthermore connected by resistor 31 to the positive source of biasing potential 28 to which is also connected by lead 19 the collector electrode of transistor switch 18.

Any command signal to switch the state of conduction of electronic switch transistor 18 is applied from the command input 40 directly to the base electrode of transistor 18. It must be pointed out that the circuit as shown in FIG. 2 is operable only to receive negative analog inputs at 13 and is only on negative command inputs at terminal 40. As may be readily apparent to those skilled in the art, however, the circuit may be easily converted to act on positive analog signals at input 13 with positive command inputs at terminal 40, if all biasing connections are reversed and all transistors shown are replaced by their complementary-conductive parts. That is, when a NPN transistor is shown, the same will be replaced with a PNP transistor and vice versa. Also, of course, the series diodes functioning as voltage limiters will have to be reversed in their connection between the base of the switching transistor and ground. That is, the anode of diode 30 will now be connected to the base while the cathode of diode 32 will be connected to ground. Also, of course, diode 39 is similarly reversed. The function of resistor 17 is to provide a current to transistor 18 such that it will be conducting, with the feedback operative, even when the signal at 13 is zero.

The operation of the electronic relay circuit shown and described with reference to FIG. 2 is as follows. First assume it is desired that the electronic relay of the invention ground out any signal appearing at signal input 13 and at a readout device that may be connected to output 15. It will be necessary that feedback loop 16 of operational amplifier 10 be closed; i.e., that electronic switch transistor 18 be fully conducting. Then, a negative-going analog signal appearing at input 13 will be applied at the base electrode of transistor 20. Since transistor 20 is an NPN transistor, a negative-going signal appearing at its base electrode will tend to decrease its conductivity between its emitter and collector electrodes. Consequently, more current will now be drawn through the transistor 22 between its collector and emitter electrodes. This increased current flow in lead 23 will make the base electrode of transistor 26 go more negative, driving transistor 26 more heavily into conduction. This increased current flow between the collector and emitter electrodes of transistor 26 will render the base electrode of electronic switching transistor 18 more positive. Since electronic switch transistor 18 is shown to be an NPN transistor, it will begin to draw a heavier collector-emitter current, and since its emitter electrode is connected via diode 39 to clamp node 11, its increased conduction will effectively cancel out, and thus ground, the signal voltage appearing at clamp node 11. It will also ground the signal output 15 and any readout device that may be connected thereto.

When it is desired to transmit the negative analog signal appearing at input 13 to output 15, operational amplifier 10 is simply rendered inoperative by opening its feedback loop 16. This is accomplished by applying a negative command signal command input terminal 40 and hence directly to the base electrode of electronic switching transistor 18. Since electronic switch transistor 18 is an NPN transistor, a negative signal of sufficient amplitude appearing at its base electrode will drive the transistor 18 toward cutoff. When the conduction of electronic switching transistor 18 has thus been sufficiently reduced, diode 39 will reverse bias and feedback loop 16 of operational amplifier 10 is thereupon opened, permitting clamp node 11 to follow the input signal appearing at input 13 and to transmit the same directly to signal output 15.

The present invention thus provides a highly efficient and very fast-acting electronic controlled clamp for use in switching analog signals emanating from a source to ground or output upon command.

Since certain changes may be made in the above described electronic clamp without departing from the scope of the invention herein involved, it is intended that all matter contained in the above disclosure or shown in the accompanying drawings shall be interpreted in an illustrative and not in a limiting sense.

What is claimed is:

1. An electronic circuit for switching a signal source of input recurrent pulses of a given magnitude, frequency and amplitude selectively between a first state and an output terminal, comprising:
 an operational amplifier having a pair of inputs and an output;
 a common junction point to which the signal source, one of the pair of operational amplifier inputs and the output terminal are commonly connected;
 a feedback circuit having switch means connected in series between the output of the operational amplifier and the common junction point; and
 a source of command input signals connected to the switch means in the feedback circuit, to activate the switch to selectively disable the operational amplifier in the presence of a command input signal, the operational amplifier being enabled in the absence of a command input signal.

2. The device of claim 1 wherein the switch means comprises:
 an electron discharge device, normally biased for conduction, having recurrent pulses its output equal in magnitude and frequency and opposite in polarity to the input recurrent pulses; and
 the command signal re-biasing the electron discharge device to non-conduction to disable the operational amplifier.

3. The device of claim 2, wherein:
 the operational amplifier consists of first and second transistors each having emitter, collector and base electrodes;
 means connecting the emitters of the first and second transistors to one end of a resistor, the other end of which is connected to a first source of reference potential;
 means connecting the base electrode of the second transistor to a second source of reference potential, the base electrode of the first transistor connected to the common junction point and the collector electrodes connected to a third source of reference potential;
 a third transistor having its base electrode connected to the collector electrode of the second transistor, its emitter electrode connected to the third source of reference potential and its collector electrode connected to the first source of reference potential;
 the switch means having emitter, collector and base electrodes, its collector electrode connected to the third source of reference potential, its base electrode connected to the collector electrode of the third transistor and its emitter electrode connected by means of a diode to the common junction point;
 means connecting the emitter electrode of the switch means to the first source of reference potential;
 a diode connected between the base electrode of the switch means and the second source of reference potential; and
 means connecting the command input signal to the base electrode of the switch means.

References Cited

UNITED STATES PATENTS

| | | | |
|---|---|---|---|
| 2,930,984 | 3/1960 | Ford | 330—9 |
| 3,058,068 | 10/1962 | Hinrichs et al. | 307—237 |
| 3,187,202 | 6/1965 | Case | 307—237 |
| 3,202,922 | 8/1965 | Schamphelaere | 330—9 |
| 3,218,566 | 11/1965 | Hayes | 330—9 |
| 3,221,186 | 11/1965 | McDonald | 307—237 |
| 3,238,383 | 3/1966 | Falk | 307—240 |
| 3,263,175 | 7/1966 | Stahl | 307—237 |
| 3,349,321 | 10/1967 | Arksey | 330—9 |
| 3,376,432 | 4/1968 | Humphreys | 307—240 |
| 3,237,116 | 2/1966 | Skinner | 307—237 |

ARTHUR GAUSS, *Primary Examiner*

H. A. DIXON, *Assistant Examiner.*

U.S. Cl. X.R.

307—253; 330—28, 30